US010276337B2

(12) United States Patent
Doering et al.

(10) Patent No.: US 10,276,337 B2
(45) Date of Patent: Apr. 30, 2019

(54) FUSES WITH INTEGRATED METALS

(71) Applicant: Littelfuse, Inc., Chicago, IL (US)

(72) Inventors: Michael Doering, Winterthurer (DE); Pascal Jung, Hohentorsheerstrasse (DE)

(73) Assignee: LITTELFUSE, INC., Chicago, IL (US)

( * ) Notice: Subject to any disclaimer, the term of this patent is extended or adjusted under 35 U.S.C. 154(b) by 0 days.

(21) Appl. No.: 15/730,054

(22) Filed: Oct. 11, 2017

(65) Prior Publication Data

US 2018/0108506 A1    Apr. 19, 2018

Related U.S. Application Data

(60) Provisional application No. 62/407,087, filed on Oct. 12, 2016.

(51) Int. Cl.
| | |
|---|---|
| *H01H 85/20* | (2006.01) |
| *H01H 85/12* | (2006.01) |
| *H01H 85/055* | (2006.01) |
| *H01H 85/30* | (2006.01) |
| *H01H 85/56* | (2006.01) |
| *H05K 1/11* | (2006.01) |
| *H05K 1/14* | (2006.01) |
| *H05K 3/00* | (2006.01) |
| *H05K 3/10* | (2006.01) |
| *H05K 3/40* | (2006.01) |
| *H05K 3/46* | (2006.01) |
| *H01H 1/58* | (2006.01) |

(Continued)

(52) U.S. Cl.
CPC .......... *H01H 85/12* (2013.01); *H01H 85/055* (2013.01); *H01H 85/20* (2013.01); *H01H 85/306* (2013.01); *H01H 85/56* (2013.01); *H05K 1/115* (2013.01); *H05K 1/144* (2013.01); *H05K 3/0047* (2013.01); *H05K 3/108* (2013.01); *H05K 3/4076* (2013.01); *H05K 3/4623* (2013.01); *H05K 3/4638* (2013.01); *H01H 2001/5877* (2013.01); *H01H 2085/025* (2013.01); *H05K 3/06* (2013.01); *H05K 2201/0338* (2013.01); *H05K 2201/041* (2013.01); *H05K 2201/096* (2013.01); *H05K 2201/09227* (2013.01); *H05K 2201/09536* (2013.01); *H05K 2203/1438* (2013.01); *H05K 2203/166* (2013.01)

(58) Field of Classification Search
CPC .... H01H 85/12; H01H 85/055; H01H 85/306; H01H 85/56; H01H 2001/5877
USPC ....................................................... 361/833
See application file for complete search history.

(56) References Cited

U.S. PATENT DOCUMENTS

| 2,790,656 A | 4/1957 | Cook |
| 3,566,008 A * | 2/1971 | Ettlinger .................. H01R 4/62 174/84 R |
| 4,375,629 A | 3/1983 | Howard |

(Continued)

OTHER PUBLICATIONS

ISR and Written Opinion dated Dec. 14, 2017 in corresponding PCT/US2017/056104.

*Primary Examiner* — Hung S Bui

(57) ABSTRACT

Fuse assemblies are disclosed. In one implementation, a fuse assembly may be disposed that includes a first portion of the second portion. The first portion may be formed of a first metal. The second portion may be formed of a second metal different from the first metal. The second metal may be copper, and the copper may be tin plated or silver plated.

20 Claims, 5 Drawing Sheets

(51) Int. Cl.
*H01H 85/02* (2006.01)
*H05K 3/06* (2006.01)

(56) References Cited

U.S. PATENT DOCUMENTS

| | | |
|---|---|---|
| 6,407,657 B1 | 6/2002 | Oh |
| 6,476,705 B1 * | 11/2002 | Betti ................. B60R 16/02 |
| | | 337/161 |
| 7,420,453 B2 | 9/2008 | Matsumara et al. |
| 8,587,401 B2 | 11/2013 | Tong et al. |
| 8,821,190 B2 | 9/2014 | Matsumara et al. |
| 2009/0251200 A1 | 10/2009 | Urrea et al. |

* cited by examiner

FUSES WITH INTEGRATED METALS

CROSS-REFERENCE TO RELATED APPLICATIONS

This application is a non-provisional of U.S. Provisional Patent Application Ser. No. 62/407,807, filed Oct. 12, 2016, entitled "Fuses with Integrated Metals," the entirety of which is expressly incorporated by reference herein.

BACKGROUND

Field of the Disclosure

Embodiments of the present disclosure generally relates to a fuse assembly, and more particularly to a master fuse assembly providing several fuses in a single assembly.

Background of the Disclosure

Fuse modules may be used in automobiles and other environments. These fuse modules generally include a housing and a fuse assembly that is disposed within the housing. The fuse assembly may include multiple fuses. The housing and the associated fuse assembly may be coupled to a battery, such as an automobile battery. The housing and the associated fuse assembly may allow for multiple fuses to be connected to a battery, thereby providing a fuse connection to multiple components (e.g., water pump and cooling fan).

Generally, a fuse assembly is made entirely from copper, tin plated copper, zinc, silver plated copper, or the like. Under low overload conditions the copper will undergo an increase in temperature. The increase in temperature may cause tin pearl in the area of the fuse assembly's melting element to migrate into the copper. The combination of the increased heat and tin migration creates an alloy that becomes extremely hot and melts and/or dissolves to create an open circuit condition by way of the fuse assembly.

Fuse assemblies made entirely from a single material, such as copper, tin plated copper, zinc, silver plated copper, or the like, may be desirable so galvanic corrosion may be avoided. However, one disadvantage of such fuse assemblies is that copper is a relatively expensive material. Therefore, it may be desirable to provide fuse assemblies that are not made entirely of copper but may still have reduced and/or eliminated corrosion between the dissimilar metals.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Fuse assemblies are disclosed herein. In one implementation, a fuse assembly may be associated with a fuse module. In a particular implementation, the fuse assembly includes a portion formed of a first metal, and another portion that is formed of a second metal different from the first metal. In one implementation, a second metal portion may be formed of copper and may include at least one fuse, and a first metal portion may be formed of a non-copper conductive metal that may be coupled to an electrical post, such as a battery post.

According to an exemplary embodiment of the present disclosure, a fuse module may include a housing, and a fuse assembly coupled to the housing. The fuse assembly may include a first portion formed of a first metal, and a second portion disposed generally perpendicular to the first portion, the second portion formed of a second metal different from the first metal. The second metal may be copper. The first metal may be a non-copper conductive metal.

According to another exemplary embodiment of the present disclosure, an apparatus may comprise a fuse assembly. The fuse assembly may include a first portion formed of a first metal, and a second portion formed of a second metal different than the first metal. The first portion may facilitate coupling of the fuse assembly to a battery, and the second portion may include at least one fuse. The second metal may be copper. The first metal may be a non-copper conductive metal.

BRIEF DESCRIPTION OF THE DRAWINGS

By way of example, specific embodiments of the disclosed device will now be described, with reference to the accompanying drawings, in which.

DETAILED DESCRIPTION OF THE DRAWINGS

Figure 1:
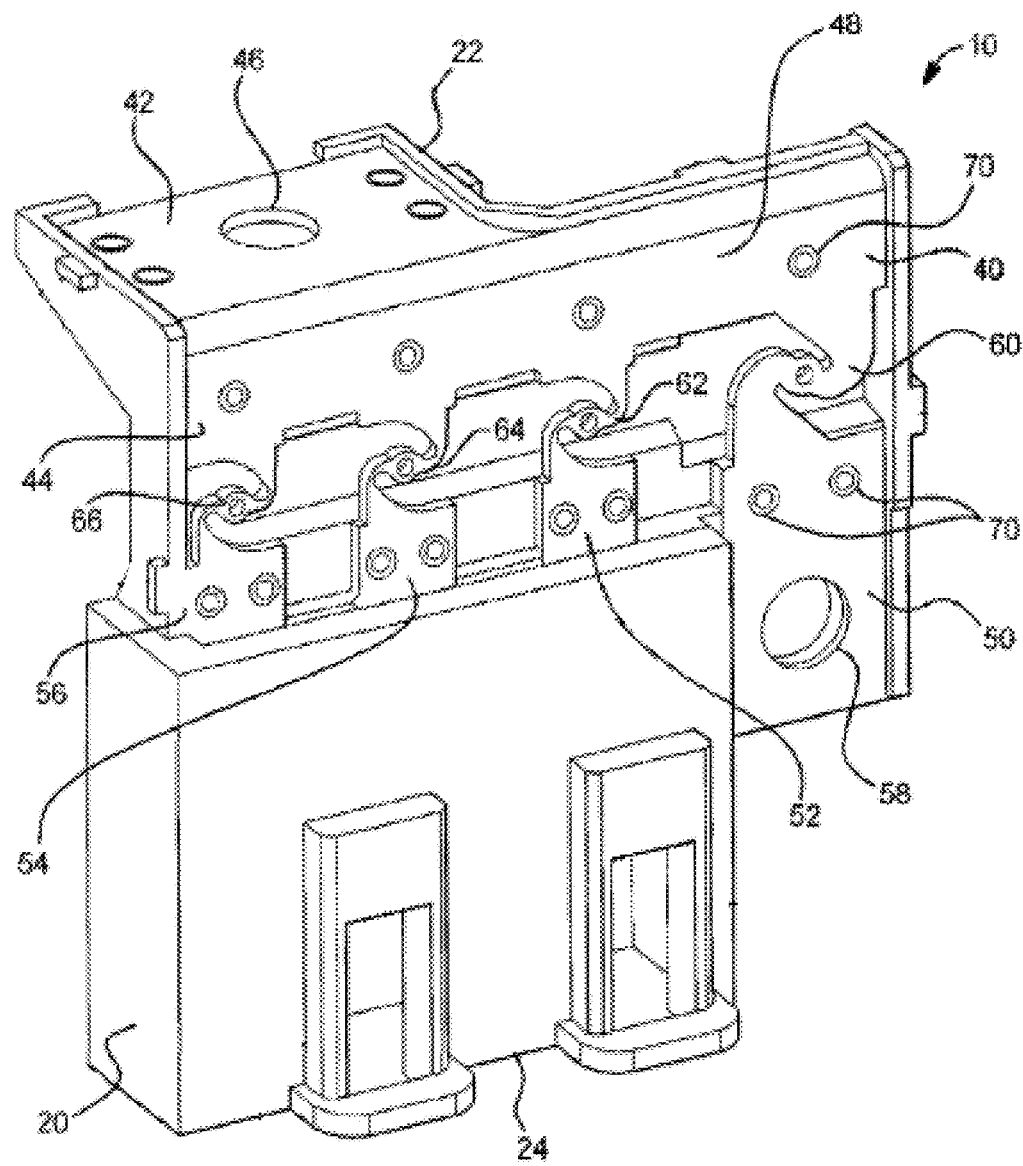
FIG. 1 is a perspective view of an exemplary embodiment of a master fuse module in accordance with the present disclosure.

A fuse module, in accordance with the present disclosure will now be described more fully hereinafter with reference to the accompanying drawings, in which certain exemplary embodiments of the fuse module are presented. The fuse module may be embodied in many different forms and is not to be construed as being limited to the embodiments set forth herein. These embodiments are provided so that this disclosure will be thorough and complete, and will convey certain exemplary aspects of the fuse module to those skilled in the art. In the drawings, like numbers refer to like elements throughout unless otherwise noted.

In one implementation, the present disclosure is directed to a fuse module. The fuse module may be particularly useful for automotive applications. The fuse module incorporates multiple fuses associated with one fuse assembly. In one implementation, the fuse assembly may comprise at least two metal types. In one example, a first portion of the fuse assembly is formed of a first metal, e.g., a non-copper metal, and a second portion of the fuse assembly is formed of a second metal different from the first metal, e.g., copper and/or copper alloy. In one implementation, the non-copper metal may be electrically conductive (e.g., aluminum). In a particular implementation, the first portion of the fuse assembly may be attached to an electrical contact, and the second portion of the fuse assembly may include one or more fuses. In one implementation, the electrical contact is a battery post. The first portion of the fuse assembly may be a bus bar of the fuse assembly. It may be advantageous for the first portion of the fuse assembly, e.g., the bus bar, to be formed of a non-copper conductive metal such as aluminum, as aluminum cables and connectors may be used to electrically connect additional components without risk of galvanic corrosion occurring. This may reduce manufacturing costs and improve reliability of the fuse, as corrosion may be reduced and/or eliminated. Additionally, in embodiments having the second portion of the fuse assembly, e.g., one or more fuses, being formed of a copper, tin-plated copper, or silver-plated copper, corrosion may also be avoided. As the fuse portion melts, only the copper (or tin-plated and/or silver-plated copper) may melt. The non-copper conductive portion (e.g., aluminum) may be a heat sink and/or conductor for the electrical path. In this manner, an intermetallic joint may be formed that may not result in galvanic corrosion between the first portion and the second portion of the fuse assembly, where the first and second portions are dissimilar metals.

FIG. 1 is a perspective view of an exemplary embodiment of a fuse module 10 according to the present disclosure. The fuse module 10 may facilitate the coupling of multiple fuses to a battery to provide fusible electrical connections to multiple external components. The fuse module 10 may include a base housing 20 and a fuse assembly 40. A cover, which is not illustrated, may be used to cover the fuse assembly 40. The base housing 20 may be configured to be disposed on a battery. The base housing 20 may be composed of an electrically insulating material, such as plastic, ceramic, etc. In one embodiment, the base housing 20 may include a first portion 22 configured to be disposed on a top portion of a battery and a second portion 24 configured to be disposed on a side portion of the battery. The first and second portions 22 and 24 may be generally planar in shape to conform to the surface of the battery. The first and second portions 22 and 24 may be disposed generally perpendicular to one another. At least the first portion 22 may have a greater length and width than shown to accommodate a fuse assembly that is sized differently than illustrated in FIG. 1.

The fuse assembly 40 may be connected to the base housing 20. The fuse assembly 40 may be made of a conductive material and provide fuses and electrical connections between the battery and the elements powered by the battery. The fuse assembly 40 includes a first planar portion 42 and a second planar portion 44 disposed generally perpendicular to the first planar portion 42. In embodiments, the first and second planar portions 42, 44 may be generally planar. In one embodiment, the first planar portion 42 may be formed of a first metal, e.g., a non-copper metal, and the second planar portion 44 may be formed of a second metal different from the first metal, e.g., copper. In one embodiment, the first planar portion 42 may be formed of an electrically conductive material (e.g., aluminum). In the embodiment illustrated in FIG. 1, the first planar portion 42 may have a length that is approximately half the length of the second planar portion 44. However, in another embodiment, the first planar portion 42 and the second planar portion 44 may have equal lengths.

The portion 42 may include an opening 46 configured for attachment to a battery clamp connected to a battery terminal post (e.g., a positive terminal of a battery). The second portion 44 may include a first terminal 48. The first terminal 48 may provide an electrical connection to fuse elements of the fuse assembly 40. The fuse assembly 40 may include at least one second terminal 50. In general, there may be multiple second terminals 50, 52, 54 and 56, each corresponding to a fuse. At least one, and generally multiple, fuses 60, 62, 64 and 66 may be disposed between the first terminal 48 and the second terminals 50, 52, 54 and 56. At least some of the fuses 60, 62, 64 and 66 may be arranged in a generally parallel arrangement, such that the fusible elements of each fuse may be, for example, of the same configuration and may be disposed the same distance from the common first terminal 48. The fuses 60, 62, 64 and 66 may be integrally formed with the various elements of the fuse assembly 40. In an embodiment, the fuses 60, 62, 64 and 66 may be configured for electrical connection to various automobile components. At least a portion of the fuse assembly 40 may be composed of copper, tin-plated copper, or silver-plated copper. In a particular implementation, only the second planar portion 44, including the fuses 60, 62, 64 and 66, may be composed of copper, tin-plated copper, or silver-plated copper. The first planar portion 42 may be composed of a non-copper conductive metal.

In one embodiment, the fuse assembly 40 may include one higher-rated fuse 60 and two or more lower-rated fuses 62, 64 and 66. The fuses 60-66 may be rated for the appropriate amperage depending on the application. The higher-rated fuse 60 is generally provided for an element that draws a larger current, such as the alternator or generator of an automobile. The higher-rated fuse 60 may be rated above about 100 A, for example. For such a rating, a bolt-down connection may be preferred. The lower-rated fuses 62, 64 and 66 may be provided for elements that draw less current, such as various fuse boxes (for example, UEC, IEC, or REC), PTC heaters, electrical power steering, and the like. The lower-rated fuses 62, 64 and 66 may be rated at about 30 to 150 amps, such as 80, 100, or 125 amps, for example.

In the embodiment shown in FIG. 1, all of the fuses 60, 62, 64 and 66 may be located on a vertical of the second planar portion 44 of the fuse assembly 40. Generally, at least one fuse may be disposed on the vertical of the second planar portion 44. Although the fuse assembly 40 in FIG. 1 includes four fuses, the fuse assembly 40 may include more or less fuses depending on the desired application.

Each fuse 60, 62, 64 and 66 may include a portion in electrical communication with the first terminal 48 and a portion in electrical communication with one of the second terminals 50, 52, 54 and 56. The fuses may be of any suitable design.

Figure 2:
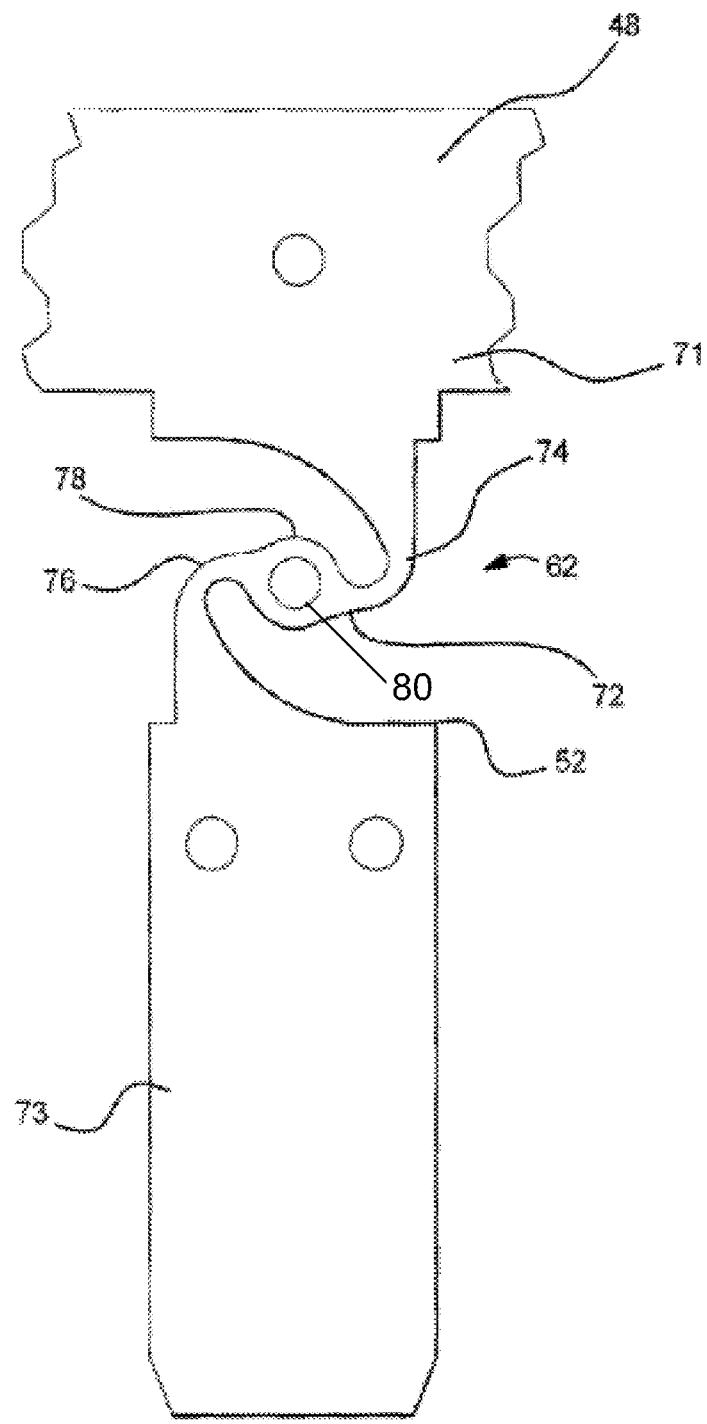
FIG. 2 illustrates an exemplary embodiment of a single fuse that may be associated with the fuse assembly of FIG. 1, in accordance with the present disclosure.

FIG. 2 illustrates an exemplary embodiment of the fuse 62 in greater detail in accordance with the present disclosure. The fuse 62 may be connectable and in electrical communication between the first terminal 48 and the second terminal 52. A portion 71 may be in electrical communication with the first terminal 48 and a portion 73 may be in electrical communication with the second terminal 52. The fuse 72 may include a pair of arms 74 and 76 extending from the respective terminals 48 and 52. Between the pair of arms 74 and 76 and in electrical contact thereto may be a disc 78 with an opening 80. The shape and thickness of the arms 74, 76 and/or the disc 78 may be provided such that when a sufficient predetermined current flows through the fuse 72, the 72 melts and causes an open circuit. In some embodiments, the arms 74, 76 may include one or more curvatures, and may have variable thicknesses to cause an open circuit upon heating as desired. In some embodiments, the disc 78 may be circular, elliptical, or any other known shape, and the opening 80 may not be present. The predetermined current of the fuse 72 may be any suitable value. The fuses 60, 64 and 66 may have a similar design as the fuse 62. In other embodiments, the fuses 60, 62, 64, and 66 may have different designs of the arms 74, 76, and/or the disc 78 (see FIGS. 3 and 4).

The fuse assembly 40 may be manufactured by any suitable method. In one embodiment, the fuse assembly 40 may be formed from a flat metal sheet. The flat metal sheet may include a first metal portion made of a first metal, e.g., a non-copper metal, and a second metal portion may be formed of a second metal different from the first metal, e.g., copper. The pattern of the fuses may be stamped or otherwise formed into the metal sheet. In one implementation, the pattern of fuses may be formed in the second metal portion made of copper.

Figure 3:
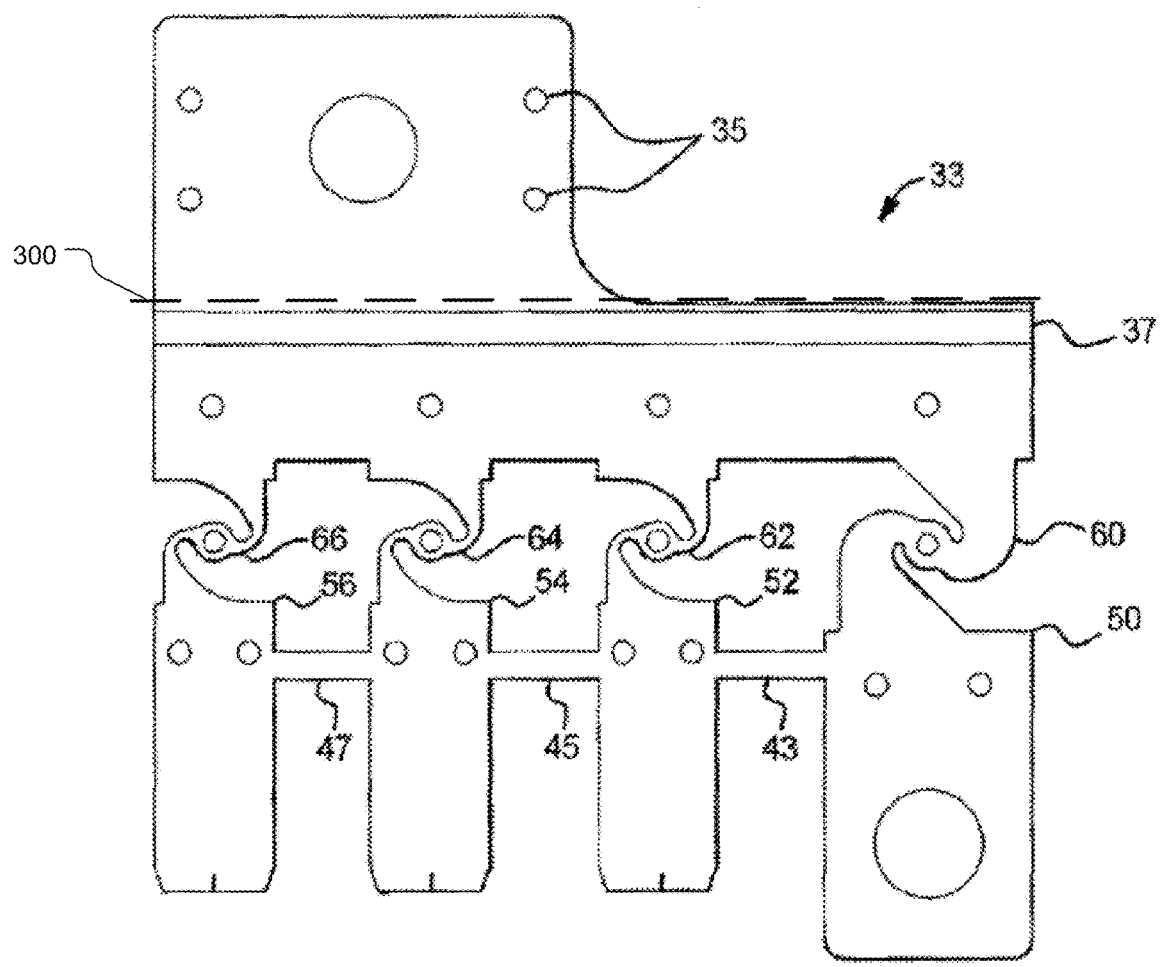
FIG. 3 illustrates an exemplary embodiment of a metal sheet stamped fuse pattern in accordance with the present disclosure.

FIG. 3 illustrates an exemplary embodiment of a metal sheet 33 with a stamped fuse pattern. The metal sheet 33 may be a contiguous and integral sheet of metal. Holes 35 may also be stamped or otherwise formed into the metal sheet 33. Rails 43, 45 and 47 may be provided in the metal sheet 33 between second terminals 50, 52, 54 and 56 to provide support for the fuse assembly 40 until it is connected to the base housing 20, due to the structural fragility around the fuses 60, 62, 64 and 66. The metal sheet 33 may be bent before or after stamping to form the fuse assembly 40. The metal sheet 33 may be bent at a 90° angle along line 37 to form first and second planar portions 42 and 44 of the fuse assembly 40, as shown in FIG. 1. The rails 43, 45 and 47 may be removed from the fuse assembly 40 after bending. The fuse assembly 40 may then be attached to the base housing 20 with fasteners 70 (see FIG. 1).

The dashed line 300 illustrated in FIG. 3 generally shows the separation of the at least two metal types associated with the fuse assembly 40 (i.e., the metal sheet 33). The metal above the dashed line 300 may be a first metal, e.g., a non-copper conductive metal that generally corresponds to the first planar portion 42. The metal below the dashed line 300 may generally correspond to the second planar portion 44, and may be formed of a second metal different from the first metal, e.g., copper, tin-plated copper, and/or silver-plated copper. Manufacturing the fuse assembly 40 to include copper, tin-plated copper or silver-platted copper only in the second planar portion 44 may greatly reduce the manufacturing cost of the fuse assembly 40.

Figure 4:
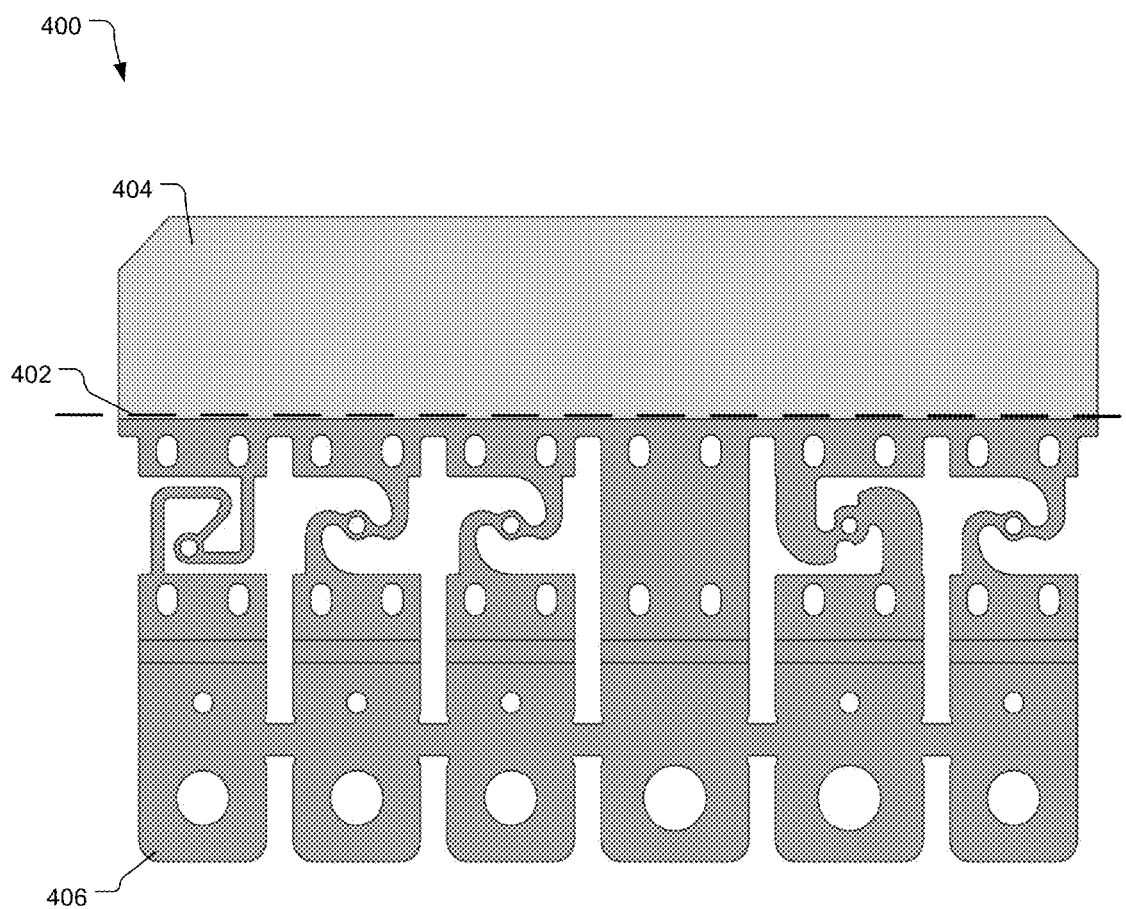
FIG. 4 illustrates another exemplary embodiment of a metal sheet stamped fuse pattern in accordance with the present disclosure.

FIG. 4 illustrates another exemplary metal sheet 400 with a stamped fuse pattern. The metal sheet 400 may be a contiguous and integral sheet of metal. The dashed line 402 illustrated generally shows the separation of the at least two metal types 404 and 406 associated with the fuse assembly 40 (i.e., the metal sheet 400). In this implementation, the first metal 404 above the dashed line 402 may be a first metal, e.g., a non-copper conductive metal (e.g., aluminum) that generally corresponds to the first planar portion 42. The second metal 406 below the dashed line 402 may generally correspond to the second planar portion 44 formed of a second metal different from the first metal, e.g., copper, tin-plated copper, and/or silver-plated copper. In some embodiments, the metal 404, 406 may extend at least partially across the dashed line 402, to join the dissimilar metals (e.g., copper and aluminum). Again, manufacturing the fuse assembly 40 to include copper, tin-plated copper and/or silver-platted copper only in the second planar portion 44 may greatly reduce the manufacturing cost of the fuse assembly 40.

Figure 5:
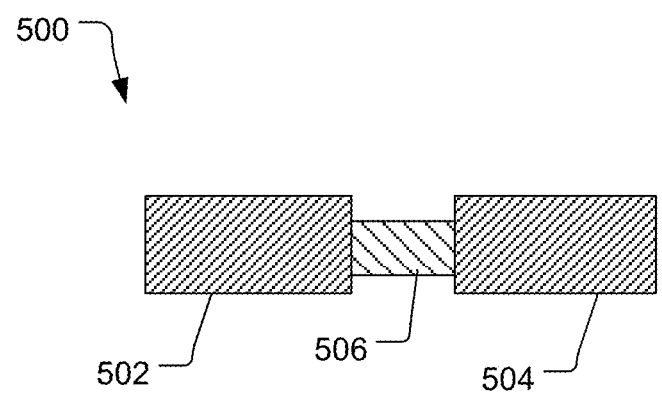
FIG. 5 illustrates an exemplary strip fuse in accordance with the present disclosure.

FIG. 5 illustrates an exemplary strip fuse 500 in accordance with the present disclosure. The exemplary strip fuse 500 may include a first connection element 502 and a second connection element 504. The first and second connection elements 502 and 504 may be formed of a first metal, e.g., a non-copper conductive metal (e.g., aluminum). The first and second connection elements 502 and 504 may be used to couple the exemplary strip fuse 500 between a battery and a load to protect the battery and/or load against overcurrent events. The strip fuse 500 may include a central portion 506 formed of a second metal different from the first metal, e.g., a copper or copper alloy, such as copper, tin-plated copper and/or silver-plated copper. In embodiments, the central portion 506 may melt and create an open circuit when an ampere rating of the strip fuse 500 is exceeded. The strip fuse 500 may therefore comprise an integral metal strip that includes a copper metal central portion 506 having a first connection element 502 at a first end of the copper metal central portion 506 and a second connection element 504 at a second end of the copper metal central portion 506.

While fuse assemblies and associated fuse housings and strip fuses have been described herein, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

As used herein, references to "an embodiment," "an implementation," "an example," and/or equivalents is not intended to be interpreted as excluding the existence of additional embodiments also incorporating the recited features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize its usefulness is not limited thereto and the present disclosure can be beneficially implemented in any number of environments for any number of purposes. Thus, the claims set forth below are to be construed in view of the full breadth and spirit of the present disclosure as described herein

What is claimed is:

1. A fuse module, comprising:
   a housing;
   a fuse assembly coupled to the housing, the fuse assembly including:
      a first portion formed of a first metal; and
      a second portion disposed generally perpendicular to the first portion, the second portion formed of a second metal different from the first metal;
      wherein the first portion and the second portion are contiguous portions of a single sheet of material having planar opposing surfaces.

2. The fuse module according to claim 1, wherein the second metal is copper.

3. The fuse module according to claim 2, wherein the copper of the second metal is tin-plated or silver-plated.

4. The fuse module according to claim 1, wherein the second portion includes at least one fuse.

5. The fuse module according to claim 4, wherein the second portion includes a plurality of fuses.

6. The fuse module according to claim 1, wherein the second portion includes a plurality of fuses, and wherein at least a first of the plurality of fuses has an ampere rating that is lower than a second of the plurality of fuses.

7. The fuse module according to claim 1, wherein the first and second portions are integrally formed to provide the fuse assembly.

8. The fuse module according to claim 1, wherein the first portion includes an opening to facilitate coupling of the first portion to a terminal post of a battery.

9. The fuse module according to claim 1, wherein the first metal is a non-copper conductive metal.

10. The fuse module according to claim 9, wherein the non-copper conductive metal is aluminum.

11. An apparatus, comprising:
 a fuse assembly including:
  a first portion formed of a first metal; and
  a second portion formed of a second metal different than the first metal, wherein the first portion facilitates coupling of the fuse assembly to a battery, and the second portion includes at least one fuse;
 wherein the first portion and the second portion are contiguous portions of a single sheet of material having planar opposing surfaces.

12. The apparatus according to claim 11, wherein the second metal is copper.

13. The apparatus according to claim 12, wherein the copper of the second metal is tin plated or silver plated.

14. The apparatus according to claim 11, further comprising a housing, the fuse assembly coupled to the housing.

15. The apparatus according to claim 11, wherein the second portion includes a plurality of fuses.

16. The apparatus according to claim 11, wherein the second portion includes a plurality of fuses, and wherein at least a first of the plurality of fuses has an ampere rating that is lower than a second of the plurality of fuses.

17. The apparatus according to claim 11, wherein the first and second portions are integrally formed to provide the fuse assembly.

18. The apparatus according to claim 11, wherein the first portion includes an opening to facilitate coupling of the first portion to a terminal post of the battery.

19. The apparatus according to claim 11, wherein the first metal is non-copper conductive metal.

20. The apparatus according to claim 19, wherein the non-copper conductive metal is aluminum.

* * * * *